(12) United States Patent
Craven et al.

(10) Patent No.: US 6,833,546 B2
(45) Date of Patent: Dec. 21, 2004

(54) SCANNING ELECTRON MICROSCOPE

(75) Inventors: John Craven, Cambridge (GB); Francis Baker, St. Neots (GB)

(73) Assignee: Cambridge University Technical Services LTD, Cambridge (GB)

( * ) Notice: Subject to any disclaimer, the term of this patent is extended or adjusted under 35 U.S.C. 154(b) by 0 days.

(21) Appl. No.: 10/220,956

(22) PCT Filed: Mar. 8, 2001

(86) PCT No.: PCT/GB01/01022

§ 371 (c)(1),
(2), (4) Date: Oct. 22, 2002

(87) PCT Pub. No.: WO01/67483

PCT Pub. Date: Sep. 13, 2001

(65) Prior Publication Data

US 2003/0141450 A1 Jul. 31, 2003

(30) Foreign Application Priority Data

Mar. 9, 2000 (GB) .............................. 0005717

(51) Int. Cl.$^7$ .............................................. G01N 23/00
(52) U.S. Cl. ....................................... 250/310; 250/397
(58) Field of Search ............................... 250/305, 306, 250/307, 309, 310, 397, 311

(56) References Cited

U.S. PATENT DOCUMENTS

| | | | | |
|---|---|---|---|---|
| 4,897,545 A | * | 1/1990 | Danilatos ..................... | 250/310 |
| 5,466,936 A | * | 11/1995 | Kohama et al. ............ | 250/310 |
| 5,491,339 A | * | 2/1996 | Mitsui et al. ............... | 250/310 |
| 5,608,218 A | * | 3/1997 | Sato et al. .................. | 250/310 |
| 5,945,672 A | * | 8/1999 | Knowles et al. ............ | 250/310 |

* cited by examiner

*Primary Examiner*—John R. Lee
*Assistant Examiner*—David A. Vanore
(74) *Attorney, Agent, or Firm*—Dykema Gossett PLLC

(57) ABSTRACT

A scanning electrode electron microscope for imaging a sample, the microscope comprising a sample chamber containing a gas in which the sample is positioned in use. A bias member is maintained at a predetermined electrical potential so as to accelerate electrons emitted from the sample. A detection system generates the image of the sample. The detection system comprises an ion collector positioned between the sample and the bias member, the ion collector being maintained at a potential below the predetermined electrical potential to thereby collect the ions from the region between the sample and the bias member. a sensor coupled to the ion collector for determining the member of ions collected thereon; and, a processing system responsive to the sensor to generate an image of the sample.

18 Claims, 9 Drawing Sheets

SCANNING ELECTRON MICROSCOPE

The present invention relates to a scanning electron microscope, and in particular, a scanning electron microscope which uses an imaging gas.

Presently, a number of types of scanning electron microscope are provided, such as the ESEM (Environmental Scanning Electron Microscope), the VPSEM (Variable Pressure Scanning Electron Microscope) and the LPSEM (Low Pressure Scanning Electron Microscope) which operate using an imaging gas to amplify secondary electrons produced by the target sample. Such systems operate by irradiating the target sample with an electron beam which in turn causes the emission of electrons from the sample, which can include the emission of secondary electrons. The secondary electrons are then accelerated towards an anode, which can be used as a detector.

The target sample is placed in a low pressure sample chamber which includes a gas such as water vapour. As the secondary electrons are accelerated towards the detector, the electrons collide with water vapour causing the production of ions and additional electrons. The ions fall back to the surface of the sample and act to compensate for any negative charge which has been induced by the irradiating electron beam. Meanwhile, the additional electrons are accelerated towards the anode, which causes a cascade effect such that for each secondary electron emitted by the sample, a number of electrons are incident on the anode.

By scanning the irradiating electron beam across the sample surface and measuring an appropriate signal, such as the number of electrons incident on the anode at each position, an image of the sample surface can be generated.

However, not all the ions produced operate to neutralise the build up of charge on the sample. Accordingly, a number of ions are typically present in the sample chamber and this can lead to a reduction in the quality of the image generated, for example due to recombination of the ions with electrons, and/or the presence of a space charge within the sample chamber which can lead to a reduction in the acceleration of the electrons towards the anode.

A solution to this has been proposed in U.S. Pat. No. 5,396,067 which describes the addition of a ion collector plate. The ion collector plate is positioned in the sample chamber between a pressure limiting aperture and the sample. The plate is charged to a positive potential below that of the pressure limiting aperture, to ensure amplification between the plate and the sample. As a result, any ions generated within the sample chamber fall back on to and are collected by the ion collector plate.

However, with the ion collector positively charged, not all the ions will be collected and accordingly, the sample will still be subject to a build-up of positive charge. Furthermore, the collector plate includes only a single aperture through which the irradiating beam must pass. This therefore can restrict the field of view to the sample. Furthermore, the presence of the collector plate can obstruct electrons emitted from the sample surface, as well as preventing additional detectors positioned in the sample chamber from monitoring the sample.

An alternative system has been proposed in U.S. Pat. No. 5,466,936 in which an ion detector is provided in the roof of the sample chamber adjacent the secondary electron detector. In this example, ions generated in the region of the secondary electron detector are collected by the ion detector and are then used in the generation of the image signal. This utilises the fact that the ions are generated by the secondary electrons, and accordingly the number of ions incident on the ion detector is also representative of the number of secondary electrons emitted from the sample.

Accordingly, by adding the signal representative of the number of ions collected by the ion collector to the signal obtained from the electron detector can lead to the production of a combined signal which can be used in the generation of an image. However, this combined signal merely increases the magnitude of the signal used by the image processing system. Accordingly, this combined signal does not result in an enhanced image which includes additional information, it is merely stated that the signal-to-noise ratio is improved when compared to an image obtained using secondary electron detection only.

In accordance with a first aspect of the present invention, we provide a scanning electron microscope for imaging a sample, the microscope comprising:

a. a sample chamber containing a gas in which the sample is positioned in use,
b. a bias member which is maintained at a predetermined electrical potential so as to accelerate electrons emitted from the sample; and,
c. an ion collector comprising one or more electrically conductive elongate members extending into a region between the sample and the bias member, the or each elongate member being maintained at a potential below the predetermined electrical potential to thereby collect the ions.

Accordingly, the present invention provides apparatus for reducing the effect of ion build up in the sample chamber of a scanning type electron microscope. This is achieved using a ion collector which is held at a predetermined potential and therefore operates to decouple the field generated by the bias member from the sample. This ensures that electrons emitted from the sample are always accelerated by a constant field between the ion collector and the bias member. Furthermore, excess ions generated within the sample chamber are discharged by the ion collector thereby reducing the effects of electron recombination and charge cloud formation in the sample chamber. In addition to this, because the ion collector is formed from one or more elongate members it therefore has a relatively small cross-sectional area compared to the sample. As a result, the ion collector does not obstruct the irradiating electron beam or prevent secondary electrons being accelerated away from the sample, whilst still allowing the absorption of ions. Furthermore, by using an ion collector with a relatively small cross-sectional area, this ensures that the view of the sample is not blocked from elsewhere within the sample chamber. This allows additional detector equipment, such as X-ray detectors, backscatter electron detectors, and cathode luminescence detectors to be used within the sample chamber.

In one example, an image of the sample is generated by a detection system which uses a sensor coupled to the bias member for determining the number of electrons incident thereon; and, a processing system responsive to the sensor to generate an image of the sample. In this case, because the ion collector decouples the field from the sample, this ensures that the secondary electrons emitted from the sample surface are accelerated towards the bias member thereby causing a cascade effect which ensures a large number of electrons are incident on the bias member. Furthermore, with space charge and recombination effectively diminished, the image generated by the signal obtained from the bias member is greatly enhanced over the image obtained without the ion collector present. This enhancement allows features to be viewed which are not normally visible using this form of detection.

Alternatively, the detection system may also comprise:

i. the ion collector;

ii. a sensor coupled to the ion collector for determining the number of ions collected thereon; and, iii. a processing system responsive to the sensor to generate an image of the sample.

In general, the image generated by determining the number of ions collected by the ion collector results in an image of similar quality to the enhanced electron image (i.e. an image of far greater quality than is normally detected when only a secondary electron detector is present). Both the enhanced electron image and the ion image allow the features to be viewed which are not normally discernable on images produced by a secondary electron detector.

In accordance with a second aspect of the present invention, we provide a scanning electron microscope for imaging a sample, the microscope comprising:

a. a sample chamber containing a gas in which the sample is positioned in use, b. a bias member which is maintained at a predetermined electrical potential so as to accelerate electrons emitted from the sample; and, c. a detection system for generating the image of the sample, the detection system comprising:

i. an ion collector positioned between the sample and the bias member, the ion collector being maintained at a potential below the predetermined electrical potential to thereby collect the ions from the region between the sample and the bias member;

ii. a sensor coupled to the ion collector for determining the number of ions collected thereon; and, iii. a processing system responsive to the sensor to generate an image of the sample.

The present invention can therefore also be advantageously used by coupling a detection system to the ion collector allowing a signal representative of the number of ions collected to be generated. This can then be used to generate an image of similar quality to the enhanced secondary electron image described above. Accordingly, this allows the secondary electron detectors to be removed from the apparatus, although of course an anode must be present.

It will be realized that the detection system of the second aspect of the present invention can use the ion collector used by the scanning electron microscope of the first aspect of the present invention. Thus, the ion collector would typically comprise one or more electrically conductive elongate members extending into a region between the sample and the bias member, the or each elongate member being maintained at a potential below the predetermined electrical potential to thereby collect the ions.

The greatest effect of the field generated by the bias member being coupled to the sample occurs in the region of where the irradiating beam impinges on the sample surface. Accordingly, it is preferable that at least one elongate member is positioned typically up to within 5 mm of the irradiating beam. However, alternative positions may be used if the elongate members are suitably biassed.

The elongate members may also be shaped so as to be positioned a constant distance from the sample, thereby ensuring the field is decoupled from the entire sample. The elongate members may therefore include annular rings, rectilinear members, or the like.

Typically the or each elongate member has a cross-sectional area of below 1.0 mm$^2$. Thicker members can be used, although these may potentially mask the imaging of the sample, and are therefore preferably avoided.

The or each elongate member is preferably maintained at a potential of 0 volts or below. This helps ensure that the positive ions generated in the region are not repelled from the wires. However, positive potentials may be used, although in this case, less ions will be collected than if negative potentials are used. Accordingly, the wires are preferably negatively biassed to therefore attract positively charged ions to the elongate members.

In any event, as long as the wires are maintained at a predetermined potential, this will act to decouple the field generated in the sample chamber from the sample, irrespective of whether a sample is conductive but electrically floating, conductive and earthed, or simply insulated.

The one or more elongate members usually comprise one or more wires. Accordingly, the ion collector typically has a number of laterally spaced wires, although a single wire is also effective. Alternatively, a number of laterally spaced wires may be arranged orthogonally with other laterally spaced wires so as to form a grid arrangement.

Wires are a convenient, readily available item that are ideal for use as the ion collector. This is because the wires have a low cross-sectional area and therefore do not obstruct the irradiating electron beam, or the generated secondary electrons emitted from the sample surface. As an alternative to wires however, the system may use any form of conductive member, such as a layer of conducting material overlaid on a non-conducting substrate. In this case, the only requirement is that the substrate and the overlaid conducting material are elongate so as to have a suitably small cross-sectional area so as to allow the present invention to function correctly.

Typically the or each wire is mounted to an electrically insulating substrate. This allows the wires to be supported relative to the sample and sample chamber, whilst allowing the potential of the wires to be controlled. However, a conducting substrate may be used if positioned sufficiently far away from the irradiating beam and sample, so as not to effect microscope operation.

In this case, the wire(s) are typically arranged to extend across the aperture such that the substrate may be positioned outside the region between the sample and the bias member. In this case, as the substrate is not the active portion of the device, the aperture can be made suitably large, so that it does not mask the sample or prevent electron emission from the sample. This ensures that the substrate does not effect the imaging either by preventing the scanning beam from irradiating the sample or by preventing the acceleration of secondary electrons away from the sample surface.

Typically the ion collector is positioned between approximately 1–3 mm from the sample surface, although alternative positions may be used depending on the circumstances. Furthermore, the ion collector is typically arranged such that at least one of the electrically conductive members is positioned within 1 to 3 mm of the irradiating electron beam.

However, in alternative sample chamber arrangements, the ion collector may be positioned in alternative locations so as to ensure the satisfactory acceleration of the secondary electrons away from the sample surface.

The microscope typically further comprises:

a. a vacuum chamber;

b. a pressure limiting aperture for coupling the sample chamber to the vacuum chamber; and c. an electron source positioned in the vacuum chamber for generating a beam of electrons, the electron source being adapted to scan the sample in use.

As set out above, the present invention utilises the realisation that sufficient ions can be removed to allow vast improvement in signal quality using only a small ion collector which is preferably either negatively biassed or grounded.

Examples of the present invention will now be described with reference to the accompanying drawings, in which.

Figure 1:
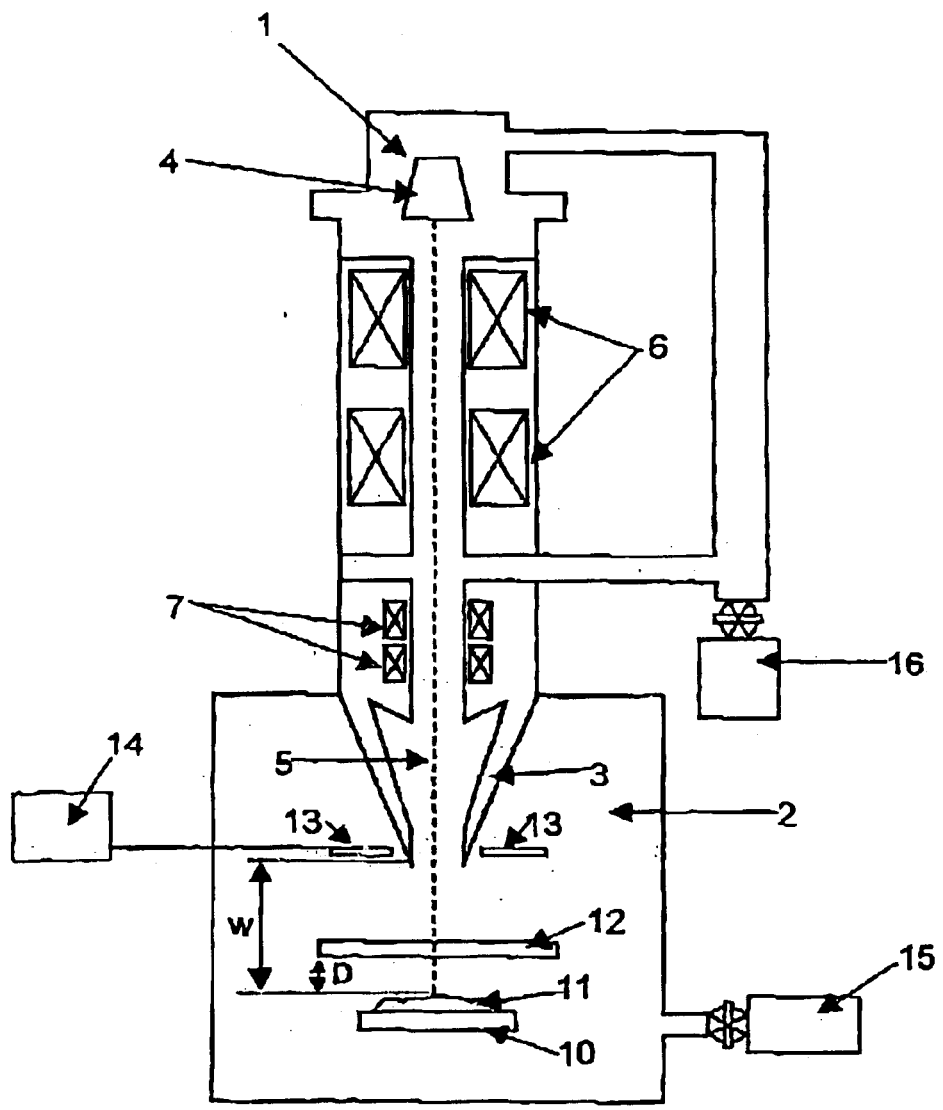
FIG. 1 is a schematic representation of a scanning electron microscope according to the present invention.

The SEM shown in FIG. 1 includes a vacuum chamber 1 coupled to a sample chamber 2 via a pressure limiting aperture 3 The vacuum chamber 1 includes an electron gun 4 which emits a beam of electrons represented by the dotted line 5. The electron beam 5 is focussed by condenser lenses 6 before passing through an objective lens 3 and into the sample chamber 2 as shown. The objective lens includes a pressure limiting aperture 3A which operates to maintain a pressure differential between the sample chamber 2 and the vacuum chamber 1.

The alignment of the electron beam 5 as it passes through the objective lens 3 is adjusted using a number of scan coils 7. The scan coils 7 adjust the electron beam alignment so that the beam scans across the surface of a sample 11. Operation of the condenser lenses 6 and the scan coils 7 is controlled by a processing system (not shown) in accordance with normal microscope operation.

A vacuum pump 16 is provided for removing gas from the vacuum chamber 1.

The sample chamber 2 contains a sample holder 10 on which the sample 11 is positioned. The sample 11 may be formed from a conducting material, in which case it can be either grounded via the sample holder 10, or alternatively it may be an insulating material, as will be appreciated by a person skilled in the art.

An ion collector 12 according to the present invention is positioned between the sample 11 and the electron gun 4, as shown.

An ion collector 12 according to the present invention is rigidly affixed to and below the standard electron detector 13 used in this type of microscope. The separation between the electron detector 13 and the ion collector 12 is typically 3 mm. The electron beam passes through the apertures in both the electron detector 13 and the ion collector 12 and is scanned over the sample. The sample can now be moved under the beam to explore different areas without the image being masked by the ion collector 12, as may happen as the ion collector passes under the electron beam where the sample is moved to a different position when the ion collector 12 is attached to the sample fixture. Both ion and electron images can be produced in this configuration.

However, the electron detector can be replaced by a simple anode through which the electron beam passes, in which case only an ion image can be formed. The anode 13 and the ion collector 12 are maintained at predetermined potentials by biassing means (not shown). The anode is typically maintained at a positive potential in the region of 500 volts in order to attract electrons emitted from the sample 11, whereas the ion collector is maintained at a lower potential as will be explained below.

In this first example, the anode 13 is coupled to image processing electronics 14 to allow an enhanced electron image to be created. A pump 15 is also provided for reducing the ambient pressure in the sample chamber 2.

Figure 2:
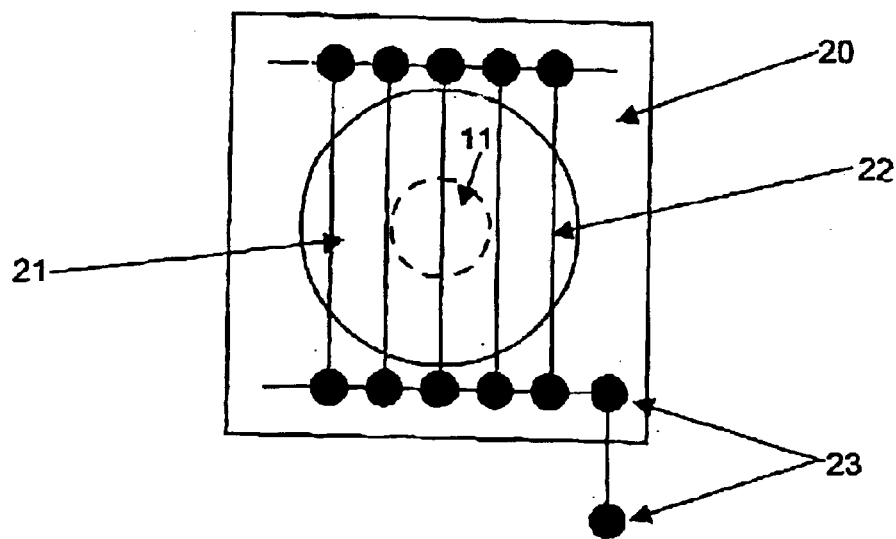
FIG. 2 is a plan view of an ion collector suitable for use in the apparatus of FIG. 1.

The ion collector 12 is shown in more detail in FIG. 2. As shown, the ion collector 12 comprises a substrate 20 typically formed from a non-conductive material, such as plastic or the like. The substrate includes an aperture 21 over which is positioned a number of laterally spaced wires 22. The wires 22 are connected via connectors 23 to biassing electronics (not shown) which operate to maintain the wires at a desired electrical potential.

In use the ion collector 12 is positioned in the sample chamber 2 such that the aperture 21 is located between the sample 11 and the electron gun 4. In this example, the position of the sample 11 is shown by the dotted lines in FIG. 2. The ion collector 12 can be used over the whole of the working distance of the microscope. However, for a microscope in which the working distance W is 8–15 mm, the ion collector is typically positioned a distance D of about 1–3 mm away from the sample, with one of the wires 22 positioned to typically within 4 mm of the irradiating electron beam 5.

In use, once the sample 11 and the ion collector 12 are located in a sample chamber, the vacuum pump 15 is activated These are controlled to pump the vacuum chamber 1 down to as low a pressure as possible, whilst the gas pressure in the sample chamber 2 is kept to between 0.1 Torr to several tens of Torr. As will be appreciated by a person skilled in the art, gas will gradually diffuse from the sample chamber 2 to the vacuum chamber 1 and it is therefore necessary to constantly operate the vacuum pump 16 to maintain the vacuum chamber at the desired pressure.

The sample is then imaged by activating the electron gun 4 and controlling the alignment of the electron beam 5, using the scan coils 7, so that the beam scans across the surface of the sample 11. As the electron beam 5 impinges on the surface of the sample 11, it will cause the generation of secondary electrons which are then emitted from the sample surface.

The secondary electrons accelerate towards the positively charged anode 13, in the normal way. As the secondary electrons accelerate towards the anode 13, this causes ionisation of the gas contained within the sample chamber. The additional electrons created during this ionisation are also accelerated towards and then absorbed by the anode 13.

As will be appreciated by a person skilled in the art, the absorption of the electrons would normally cause a decrease in the electrical potential of the anode 13. However, in this case, the anode is maintained at a predetermined potential by a biassing means (not shown). The additional electrical energy required to maintain this constant potential is representative of the number of electrons which are absorbed by the anode 13 at any one time. Accordingly, the processing electronics 14 can use this information to generate an image of the sample surface.

Simultaneously, the ions generated by the ionisation of the gas are repelled from the anode 13 and accordingly, fall back towards the ion collector 12. By having the ion collector either negatively charged, grounded, or positively charged to a lesser degree than the electron anode 13, then the positively charged ions will be attracted to and discharged by the ion collector 12.

In addition to this, the ion collector 12 operates to decouple the field generated by the anode from the sample 11. This will now be explained in more detail with respect to FIGS. 4A and 4B.

Figure 4A:
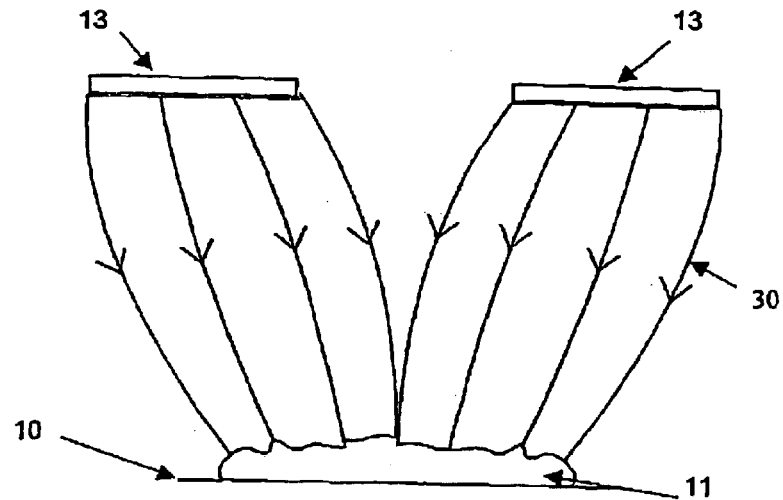
FIG. 4A is a schematic diagram of a field generated in a prior art SEM.
Figure 4B:
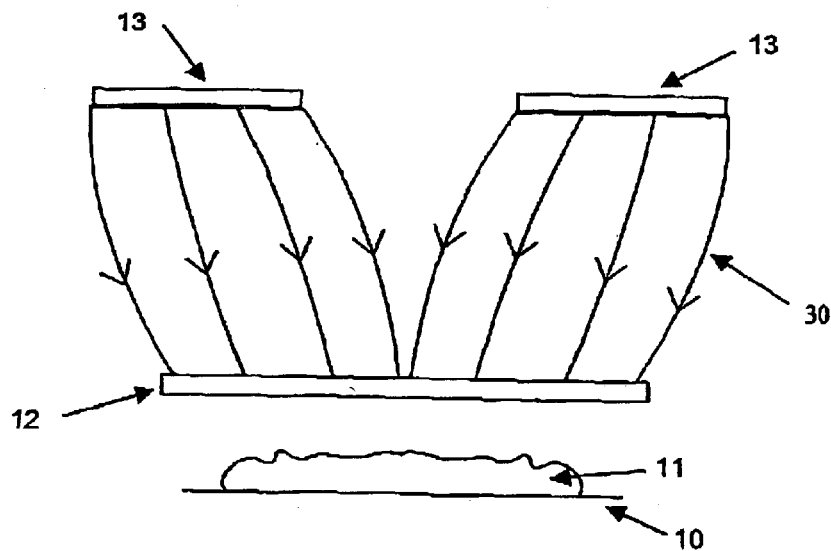
FIG. 4B is a schematic diagram of a field generated in the apparatus of FIG. 2.

FIG. 4A shows the field generated in the sample chamber between the anode 13 and the sample 11, when no ion collector is present. In this example, the field, which is represented by the lines 30, extends all the way to the surface of the sample 11, as shown. In contrast to this, as shown in FIG. 4B, with the ion collector 12 present, typically the field lines 30 only extend as far as the ion collector, thereby partially decoupling the sample from the imposed electric field.

In normal ESEM operation some ions are used to keep the sample surface neutral, excess ions from the cascade can form an ion charge cloud and or recombine with secondary electrons from the sample 11, thereby affecting the quality of the secondary electron image.

Accordingly, the presence of the ion collector will reduce the affect of these excess ions and thus allow the electrons to experience the full imposed electric field to produce the enhanced electron image.

If the field generated within the sample chamber 2 is not decoupled from the sample, then the field will be effected. As a result, this affects the acceleration of electrons towards the anode which as a result can lead to a change in the number of electrons produced by the cascade process thereby effecting the image determined by the image processing electronics 14. Accordingly, decoupling the field from the sample using the ion collector overcomes these problems.

Furthermore, under normal circumstances the ions generated by the ionisation process will form an ion cloud within the sample chamber 2. This again has two effects.

Firstly, the presence of an ion cloud will again distort the field generated within the sample chamber 2. Again this can effect the number of electrons incident on the anode 13.

Secondly, with a large number of ions present in the sample chamber 2, secondary electrons emitted from the sample surface can recombine with these ions and accordingly, the information concerning the sample 11 which is contained within these recombined secondary electrons is lost.

These excess ions may also form an ion layer on the surface of the sample 11 which, as mentioned above, can distort the field in the sample chamber, as well as resulting in additional recombination effects.

However, the ion collector again overcomes these problems by removing excess ions from the sample chamber.

A further possible factor is that under normal circumstances the field generated by the electron anode 13 can extend into the sample, thereby effecting not only the properties of the sample but also the ability to generate secondary electrons. However, the ion collector acts as a shield and therefore reduces the effects of the field on the sample itself.

Thus, with the ion collector present, the field is decoupled from the sample 2, so that the field between the ion collector and the anode remains constant, thereby ensuring constant acceleration of the electrons away from the sample surface.

Furthermore, the removal of the excess ions from the sample chamber 2 reduces the recombination effects and prevents the build up of any charge cloud within the chamber. As a result, the secondary electron image generated by the image processing electronics 14 is enhanced to a far better quality than is available without the ion collector present.

It will be realised from this that if the ion collector is positioned too close to the sample, then the sample will not be totally decoupled from the field. Furthermore, if the ion collector is too far away from the sample, then the emitted secondary electrons will not be correctly accelerated by the field. Accordingly, the ion collector is typically positioned 1–3 mm from the sample. Furthermore, as the greatest effect is required at the point at which the sample is exposed to the electron beam, the ion collector should have one of the wires located within a typical radial distance of 1 to 4 mm from the irradiating beam.

Figure 3A:
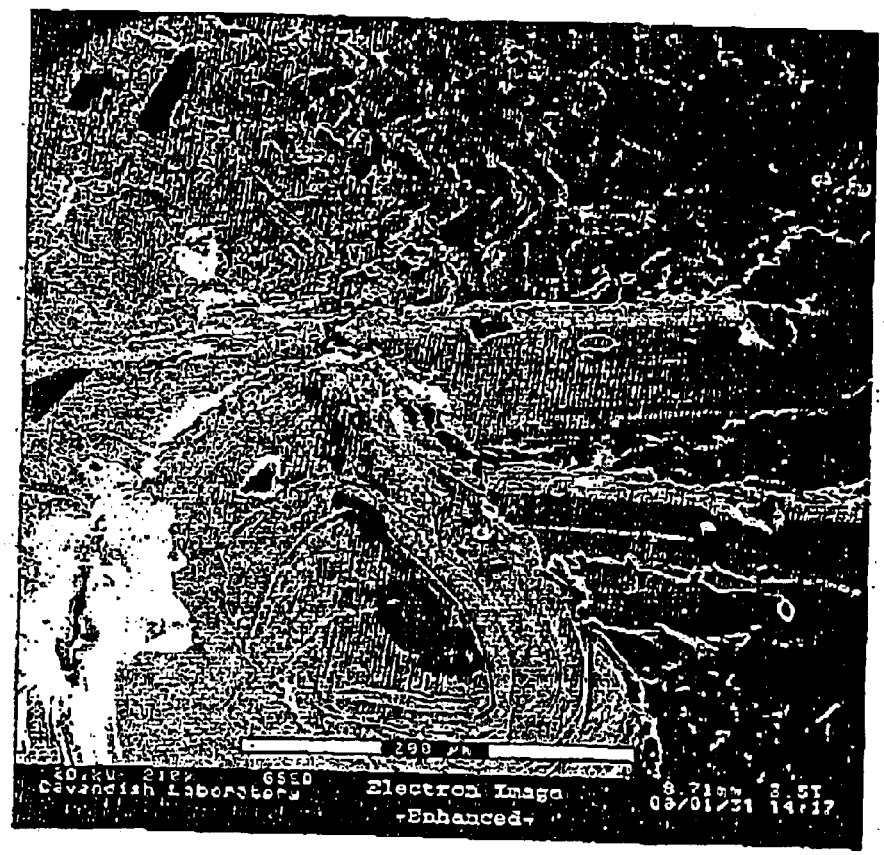
FIG. 3A is an example of an enhanced electron image obtained from an ESEM of the present invention.

An example of an enhanced electron image which is obtained using the present invention, is shown in FIG. 3A. This can be compared to a non-enhanced image which is obtained using the same sample under the same conditions, but without the ion collector 12 of the present invention as shown in FIG. 3C.

Figure 3B:
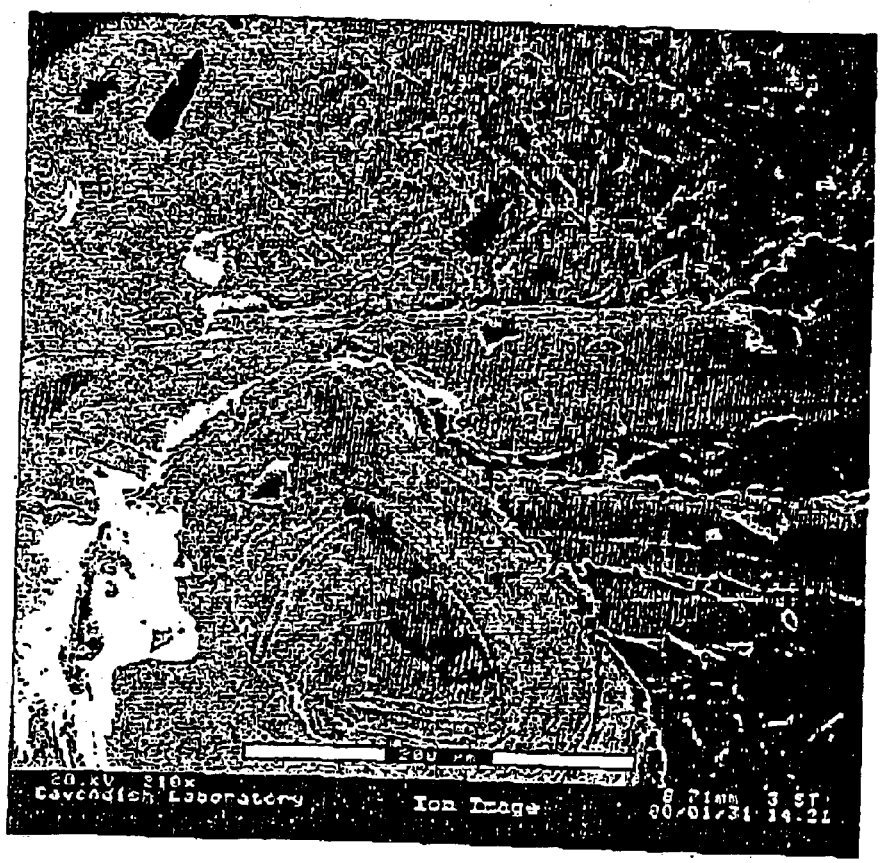
FIG. 3B is an example of an ion image obtained from an ESEM of the present invention.
Figure 3C:
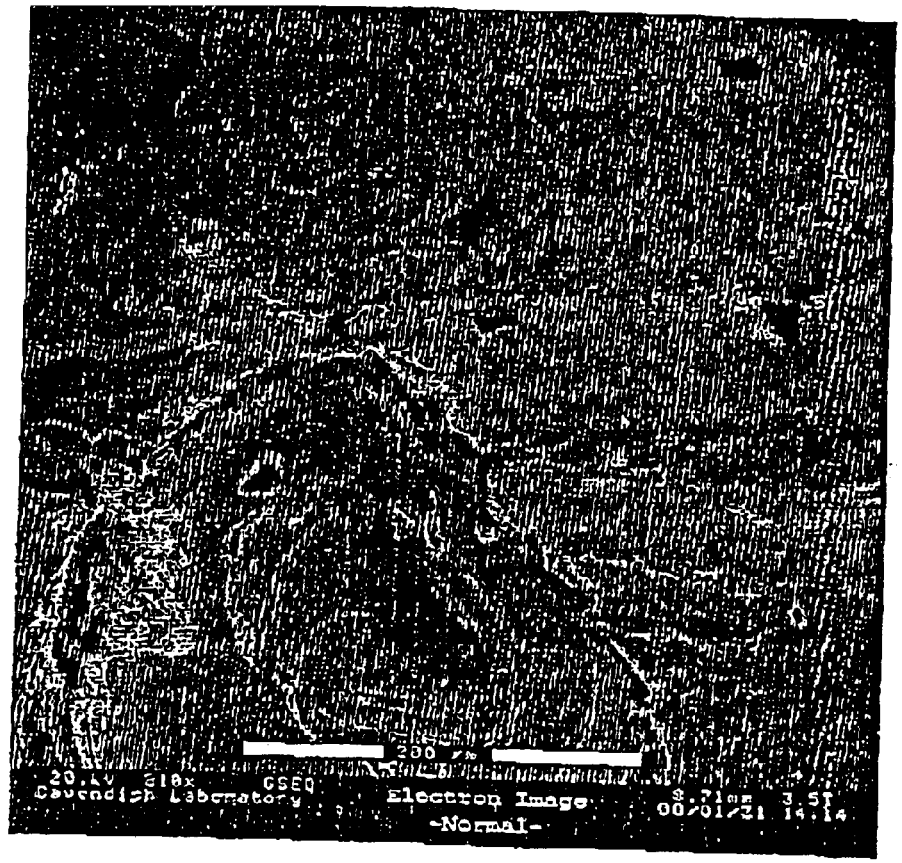
FIG. 3C is an example of an image obtained from a prior art ESEM.

As clearly shown in FIGS. 3A and 3C, a greater detail of structure is visible in the enhanced image. Thus, the enhancement provided by the present invention represents not only increases the signal level obtained by the secondary electron anode 13 but also increases the amount of information which can be obtained from the signal. This is due to the improved field within the sample chamber 2, as well as the reduction in the recombination and space change effects.

An alternative technique which can be used by the present invention is to obtain an image from the ion collector 12 instead of the anode 13.

In this case, the image processing electronics 14 are coupled to the ion collector 12. The ion collector 12 is maintained at a predetermined electrical potential in the usual way and the additional electrical energy required to maintain this constant potential can be detected by the image processing electronics 14. Accordingly, the signal can be processed in an identical manner to the signal obtained from the anode 13 allowing the processing electronics 14 to generate an image of the sample surface in the normal way.

An example of the image obtained from the ion collector is shown in FIG. 3B. As shown, this is similar to the enhanced electron image that would be obtained from the apparatus shown in FIG. 1 and is therefore an improvement over the non-enhanced image that will be obtained using the prior art, as shown in FIG. 3C.

Figure 5:
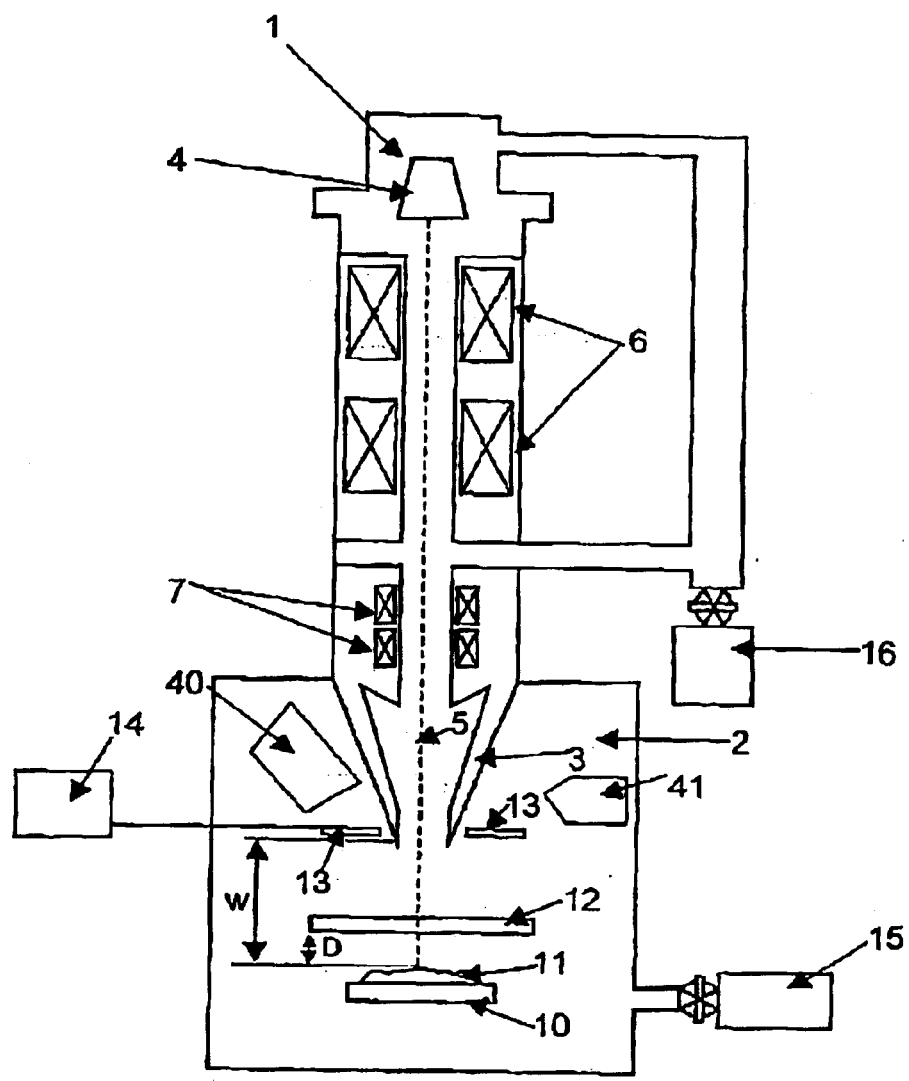
FIG. 5 shows an alternative SEM design which incorporates additional detectors.

A particular advantage of the ion collector of the present invention is that it allows additional detector apparatus to be included within the sample chamber whilst producing an enhanced image, which cannot be achieved using prior art devices. An example of such apparatus is shown in FIG. 5, which shows the addition of a back scatter detector 40, or an X-ray detector 41, as shown. It will be realised that in this case the ion collector 12 is arranged so that the detectors 40, 41 have a direct view of the sample, which in this case is achieved by aligning the detectors with the sample through the aperture 21.

From the above it will be realised that an image of the sample 11 can then be generated using any one of the following methods:

i) An enhanced image can be derived from the electron detector;
 ii) an enhanced image can be derived from the ion collector; and,
 iii) an enhanced image can be derived from a combination of both of the above.

Accordingly, the processing electronics similar to 14 can determine either the. number of electrons, and/or the number of ions generated, to produce a representation of the surface of the sample.

Figure 6A:
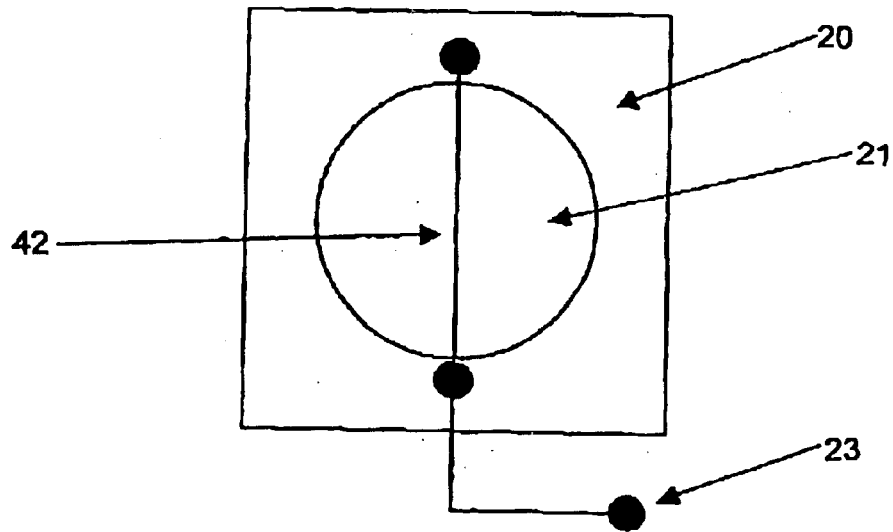
FIGS. 6A, 6B and 6C are example of alternative ion collectors suitable for use in the apparatus of FIGS. 1 and 5.
Figure 6B:
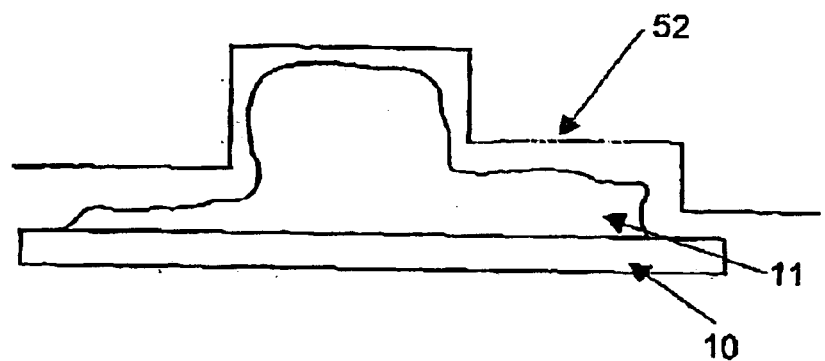
Figure 6C:
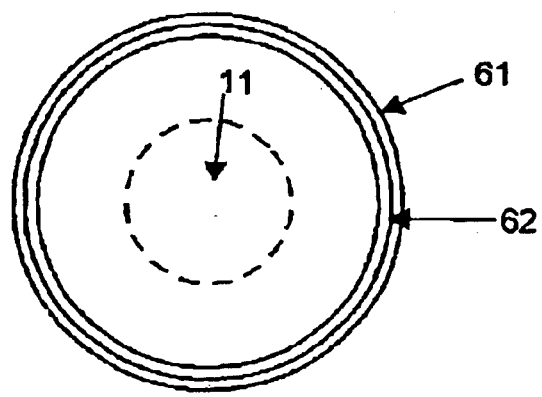

A number of alternative designs of ion collector 12 which could be used in the apparatus of FIGS. 2 and 5 are shown in FIGS. 6A, 6B and 6C.

In the example of FIG. 6A, a single wire 42 is provided above the aperture 21 in the substrate 20. It has been shown that a single wire is sufficient to discharge the ions generated in the sample chamber and accordingly, a system using this ion collector will operate as efficiently as a number of laterally spaced wires, as described with respect to FIG. 2.

FIG. 6B is a side view of an ion collector having a single wire 52 which is shaped to complement the shape of the sample, thereby ensuring that the correct distance is maintained between the sample and the ion collector.

FIG. 6C is a plan view of an ion collector formed from an annular plastic substrate 61, overlaid with a conductive strip 62, as shown, or simply a ring formed from a wire.

Figure 7:
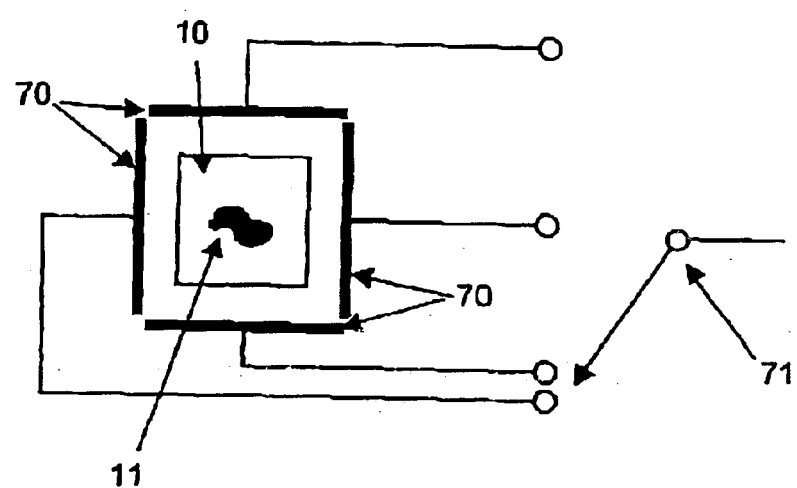
FIG. 7 shows a further feature that may be employed in the apparatus of FIGS. 1 and 5.

FIG. 7 shows an additional component that may be positioned around the sample 11 in any of the examples of the invention. This component comprises four electrodes 70 formed from wires, one electrode 70 positioned on each side of the sample 11 in use. A switch 71 allows selection of a particular electrode 70 by an operator in use. The additional component of FIG. 7 enables an operator to produce a shadowing effect. If one of the electrodes 70 is activated then the amplification field of the apparatus is distorted such that more ions are collected on the side nearest the activated electrode 70. This gives a shadow effect. This shadow effect is of benefit in that, for a rough sample 11, it can be used to determine whether the sample has an asperity or a depression. The provision of 4 electrodes 70 enables a shadowing effect to be produced in which ever direction is desirable to aid analysis of a sample 11.

What is claimed is:

1. A scanning electron microscope for imaging a sample, the microscope comprising:
   a. a sample chamber containing a gas in which the sample is positioned in use,
   b. a bias member which is maintained at a predetermined electrical potential so as to accelerate electrons emitted from the sample for interaction with the gas to produce ions thereof; and
   c. a detection system for generating the image of the sample, the detection system comprising:
      i. an ion collector positioned between the sample and the bias member, the ion collector being maintained at a potential below the predetermined electrical potential to thereby collect the ions from the region between the sample and the bias member;
      ii. a sensor coupled to the ion collector for determining the number of ions collected thereon; and,
      iii. a processing system responsive to the sensor to generate an image of the sample.

2. A microscope according to claim 1, wherein the ion collector comprises one or more electrically conductive elongate members extending into a region between the sample and the bias member, the or each elongate member being maintained at a potential below the predetermined electrical potential to thereby collect the ions.

3. A scanning electron microscope for imaging a sample, the microscope comprising:
   a. a sample chamber containing a gas in which the sample is positioned in use,
   b. a bias member which is maintained at a predetermined electrical potential so as to accelerate electrons emitted from the sample; and,
   c. an ion collector comprising one or more electrically conductive elongate members extending into a region between the sample and the bias member, the or each elongate member being maintained at a potential below the predetermined electrical potential to thereby collect the ions.

4. A microscope according to claim 2, the microscope further comprising a detection system for generating the image of the sample, the detection system comprising:
   i. the bias member;
   ii. a sensor coupled to the bias member for determining the number of electrons incident thereon; and,
   iii. a processing system responsive to the sensor to generate an image of the sample.

5. A microscope according to claim 4, the microscope further comprising a detection system for generating the image of the sample, the detection system comprising:
   i. the ion collector;
   ii. a sensor coupled to the ion collector for determining the number of ions collected thereon; and,
   iii. a processing system responsive to the sensor to generate an image of the sample.

6. A microscope according to claim 2, wherein, in use, at least one elongate member is positioned less than 4 mm from the irradiating beam.

7. A microscope according to claim 2, wherein the one or more elongate members may be shaped so as position the elongate member a constant distance from the sample surface.

8. A microscope according to claim 2, the or each elongate member having a cross sectional area of below 1.0 mm$^2$.

9. A microscope according to claim 2, wherein the or each elongate member is maintained at a potential of 0 volts or below.

10. A microscope according to claim 2, wherein the one or more elongate members comprise one or more wires.

11. A microscope according to claim 2, the ion collector comprising a number of laterally spaced wires.

12. A microscope according to claim 5, wherein the ion collector comprises at least one wire mounted to an electrically insulating substrate.

13. A microscope according to claim 8, wherein the substrate includes an aperture, the at least one wire being arranged to extend across the aperture such that the substrate may be positioned outside the region between the sample and the bias member.

14. A microscope according to claim 1, wherein, in use, the ion collector is positioned approximately 1–3 mm from the sample.

15. A microscope according to claim 1, wherein the microscope further comprises:
   a. a vacuum chamber;
   b. a pressure limiting aperture for coupling the sample chamber to the vacuum chamber; and
   c. an electron source positioned in the vacuum chamber for generating a beam of electrons, the electron source being adapted to scan the sample in use.

16. A microscope according to claim 15, further including an electron detector, wherein the ion collector is arranged to scan with the electron detector.

17. An apparatus according to claim 1 further comprising at least one electrode arranged to be positioned, in use, adjacent to a sample, such that the electrode can be activated to generate an image with a shadowing effect in the direction of the electrode.

18. A scanning electron microscope for imaging a sample comprising:

a. a sample chamber for receiving the sample therein at a sample location, said chamber for containing a gas;
b. a bias member operative at a predetermined electrical bias potential to accelerate electrons emitted from the sample; and
c. a detection system for generating an image of the sample, including:
   i. an ion collector positioned between the sample location and the bias member, at least one electrically conductive elongate member extending into a region between the sample and the bias member and having a cross sectional area below 1.0 $mm^2$, and being operative at a potential below the bias potential to collect ions from the region;
   ii. a sensor coupled to the ion collector for determining the number of ions collected thereon; and,
   iii. a processing system responsive to the sensor to generate an image of the sample.

* * * * *